(12) United States Patent
Lee et al.

(10) Patent No.: US 8,956,962 B2
(45) Date of Patent: Feb. 17, 2015

(54) METHOD FOR FABRICATING LARGE-AREA NANOSCALE PATTERN

(75) Inventors: Young-Jae Lee, Seoul (KR); Kyoung Jong Yoo, Seoul (KR); Jin Su Kim, Seoul (KR); Jun Lee, Seoul (KR); Yong In Lee, Seoul (KR); JunBo Yoon, Seoul (KR); JeongHo Yeon, Seoul (KR); Joo-Hyung Lee, Seoul (KR); Jeong Oen Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 26 days.

(21) Appl. No.: 13/242,331

(22) Filed: Sep. 23, 2011

(65) Prior Publication Data

US 2012/0156882 A1      Jun. 21, 2012

(30) Foreign Application Priority Data

Dec. 16, 2010    (KR) .................. 10-2010-0129255

(51) Int. Cl.
*H01L 21/40*     (2006.01)
*H01L 21/033*    (2006.01)
*B82Y 10/00*     (2011.01)

(52) U.S. Cl.
CPC ........ *H01L 21/0337* (2013.01); *H01L 21/0338* (2013.01); *B82Y 10/00* (2013.01); *Y10S 438/947* (2013.01)
USPC .......................................... 438/551; 438/947

(58) Field of Classification Search
CPC .................................................... H01L 21/3088
USPC .................................................. 438/947, 551
See application file for complete search history.

(56) References Cited

U.S. PATENT DOCUMENTS

2006/0262511 A1*   11/2006   Abatchev et al. ............. 361/792
2008/0122125 A1*    5/2008   Zhou ............................ 257/797
2011/0129991 A1*    6/2011   Armstrong et al. ........... 438/585

FOREIGN PATENT DOCUMENTS

KR   10-2009-0000882 A   1/2009
KR   10-2010-0079002 A   7/2010

* cited by examiner

*Primary Examiner* — Allen Parker
(74) *Attorney, Agent, or Firm* — Saliwanchik, Lloyd & Eisenschenk

(57) ABSTRACT

A method for fabricating a large-area nanoscale pattern includes: forming multilayer main thin films isolated by passivation layers; patterning a first main thin film to form a first main pattern; forming a first spacer pattern with respect to the first main pattern; and forming a second main pattern by transferring the first spacer pattern onto a second main thin film. By using multilayer main thin films isolated by different passivation films, spacer lithography capable of reducing a pattern pitch can be repetitively performed, and the pattern pitch is repetitively reduced without shape distortion after formation of micrometer-scale patterns, thereby forming nanometer-scale fine patterns uniformly over a wide area.

8 Claims, 8 Drawing Sheets

METHOD FOR FABRICATING LARGE-AREA NANOSCALE PATTERN

CROSS REFERENCE TO RELATED APPLICATION

This application claims the benefit under 35 U.S.C. §119 of Korean Patent Application No. 10-2010-0129255, filed on Dec. 16, 2010, which is hereby incorporated by reference in its entirety.

BACKGROUND

1. Technical Field

The present invention relates to technology that can easily fabricate nanoscale patterns on a large-area substrate.

2. Description of the Related Art

In manufacturing a semiconductor device, it is necessary to form a plurality of fine patterns, such as word lines, digit lines, or contacts. In general, these fine patterns are formed using a lithography technique.

A contact lithography process that has been traditionally widely used can form patterns over a wide area, but there is a limitation (1-2 um) on a pitch of fine patterns due to a diffraction limit of light.

To overcome such a limitation, a stepper, a scanner, an E-beam lithography, a holographic lithography, and so on, have been developed. However, these methods need complicated and sophisticated equipment and considerable expense, and there is a limitation on an area for pattern formation.

However, the existing lithography process has a fundamental limitation in forming nanoscale fine patterns due to the limit of equipment or problems of process characteristic. More specifically, the conventional lithography technique has difficulty in forming nanoscale patterns uniformly over a large area of 8 inches or more.

Technical Problem

An aspect of the present invention is directed to a process technique in which, due to the use of multilayer main thin films isolated by different passivation films, spacer lithography capable of reducing a pattern pitch can be repetitively performed, and the pattern pitch is repetitively reduced without shape distortion after formation of micrometer-scale patterns, thereby forming nanometer-scale fine patterns uniformly over a wide area.

Technical Solution

According to an embodiment of the present invention, a method for fabricating a large-area nanoscale pattern includes: forming multilayer main thin films isolated by passivation layers; patterning a first main thin film to form a first main pattern; forming a first spacer pattern with respect to the first main pattern; and forming a second main pattern by transferring the first spacer pattern onto a second main thin film.

The method may further include performing a pattern pitch reducing process at least one time, wherein the pattern pitch reducing process includes: forming a second spacer pattern with respect to the second main pattern; and forming a third main pattern by transferring the second spacer pattern onto a third main thin film.

The present invention may provide a manufacturing process implemented with processes different from the above processes.

In the above-described processes, the process of forming the first spacer pattern with respect to the first main pattern may include: oxidizing the first main pattern to form a side spacer pattern on a side surface of the main pattern; and removing the first main pattern disposed at the central part of the side spacer pattern.

In this case, the process of forming the second main pattern by transferring the first spacer pattern onto the second main thin film may include: exposing a second main thin film by etching a second passivation layer exposed under the side spacer pattern; vertically etching the exposed second main thin film using the side spacer pattern or the second passivation layer as a mask; and removing the side spacer pattern or the second passivation layer to form a second main pattern.

Advantageous Effects

According to the present invention, due to the use of multilayer main thin films isolated by different passivation films, spacer lithography capable of reducing a pattern pitch can be repetitively performed, and the pattern pitch is repetitively reduced without shape distortion after formation of micrometer-scale patterns, thereby forming nanometer-scale fine patterns uniformly over a wide area.

BRIEF DESCRIPTION OF THE DRAWINGS

The above and other aspects, features and advantages of certain exemplary embodiments of the present invention will be more apparent from the following description taken in conjunction with the accompanying drawings, in which.

Figure 1:
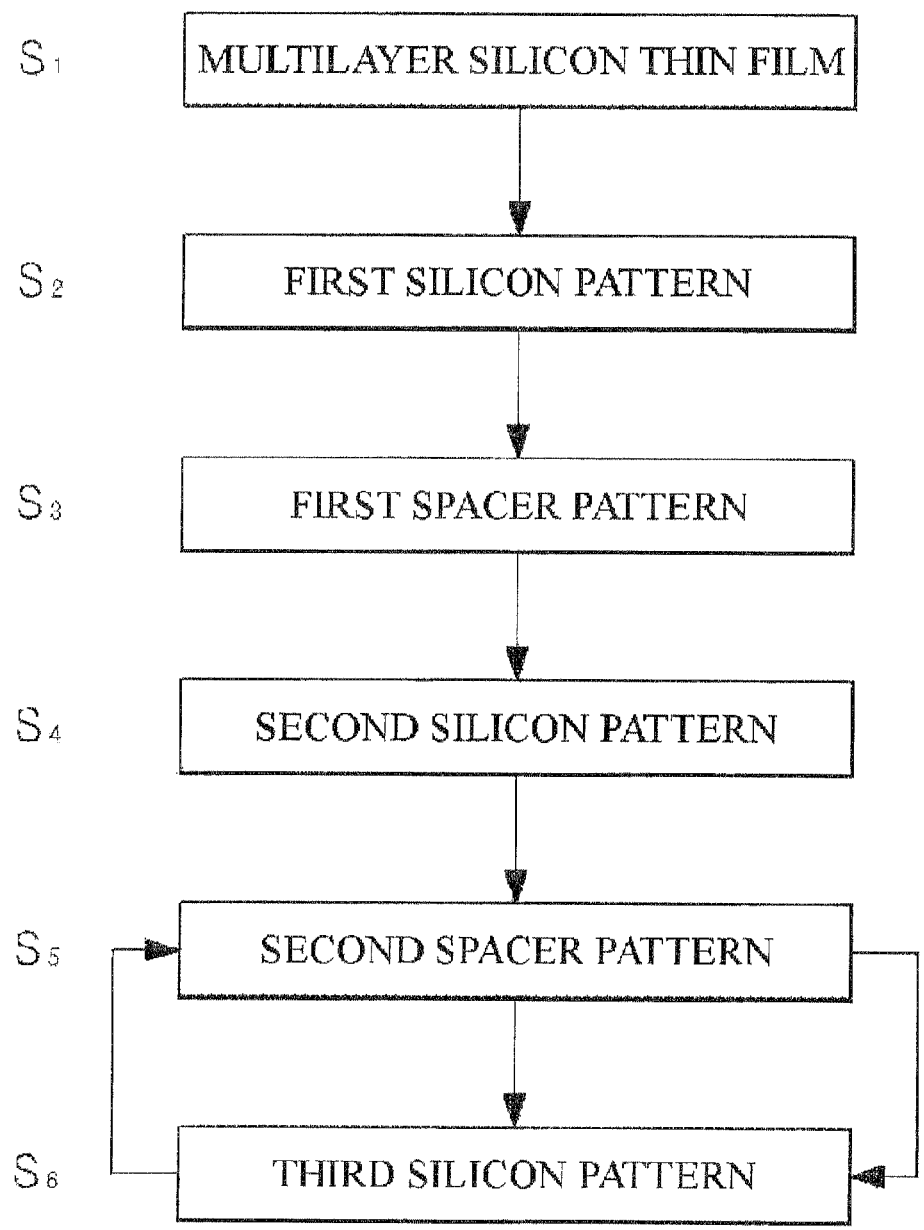
FIG. 1 is a flowchart of a manufacturing process according to the present invention.

REFERENCE NUMERALS 110, 130, 150: first to third passivation layers
120, 140, 160: first to third main thin films
121, 141, 161: first to third main patterns
190: spacer layer
191: first spacer pattern
192: second spacer pattern
210: first passivation layer
220, 230: second passivation layer
260, 270: third passivation layer
220, 250, 280: first to third main thin films
310, 320, 350: first to third main thin films
310, 330, 340, 360, 370: first and third passivation layers

BEST MODE

Exemplary embodiments of the present invention will be described below in detail with reference to the accompanying drawings. Wherever possible, the same reference numerals will be used to refer to the same elements throughout the specification, and a duplicated description thereof will be omitted. It will be understood that although the terms "first", "second", etc. are used herein to describe various elements, these elements should not be limited by these terms. These terms are only used to distinguish one element from another element.

According to the present invention, different thin films are buried in multilayers, and spacer-shaped patterns formed by spacer lithography are copied/reproduced on a lower layer part, and a pattern pitch is repetitively reduced without shape distortion. Thus, nanometer-scale fine patterns can be formed uniformly over a wide area.

FIG. 1 is a flowchart of a manufacturing method according to the present invention.

Referring to FIG. 1, the manufacturing method according to the present invention may include: a first process of forming multilayer main thin films isolated by passivation layers; a second process of patterning a first main thin film to form a first main pattern; a third process of forming a first spacer pattern with respect to the first main pattern; and a fourth process of transferring the first spacer pattern onto a second main thin film to form a second main pattern.

In addition, in order to efficiently reduce a pattern pitch, a pattern pitch reducing process may be performed twice or more. The pattern pitch reducing process includes: a fifth process of forming a second spacer pattern with respect to the second main pattern; and a sixth process of transferring the second spacer pattern onto a third main thin film to form a third main pattern.

First Embodiment

A method for manufacturing a large-area nanoscale pattern according to the present invention will be described in detail with reference to FIGS. 2 and 3.

(1) First Main Pattern Forming Process (S1)

Figure 2:
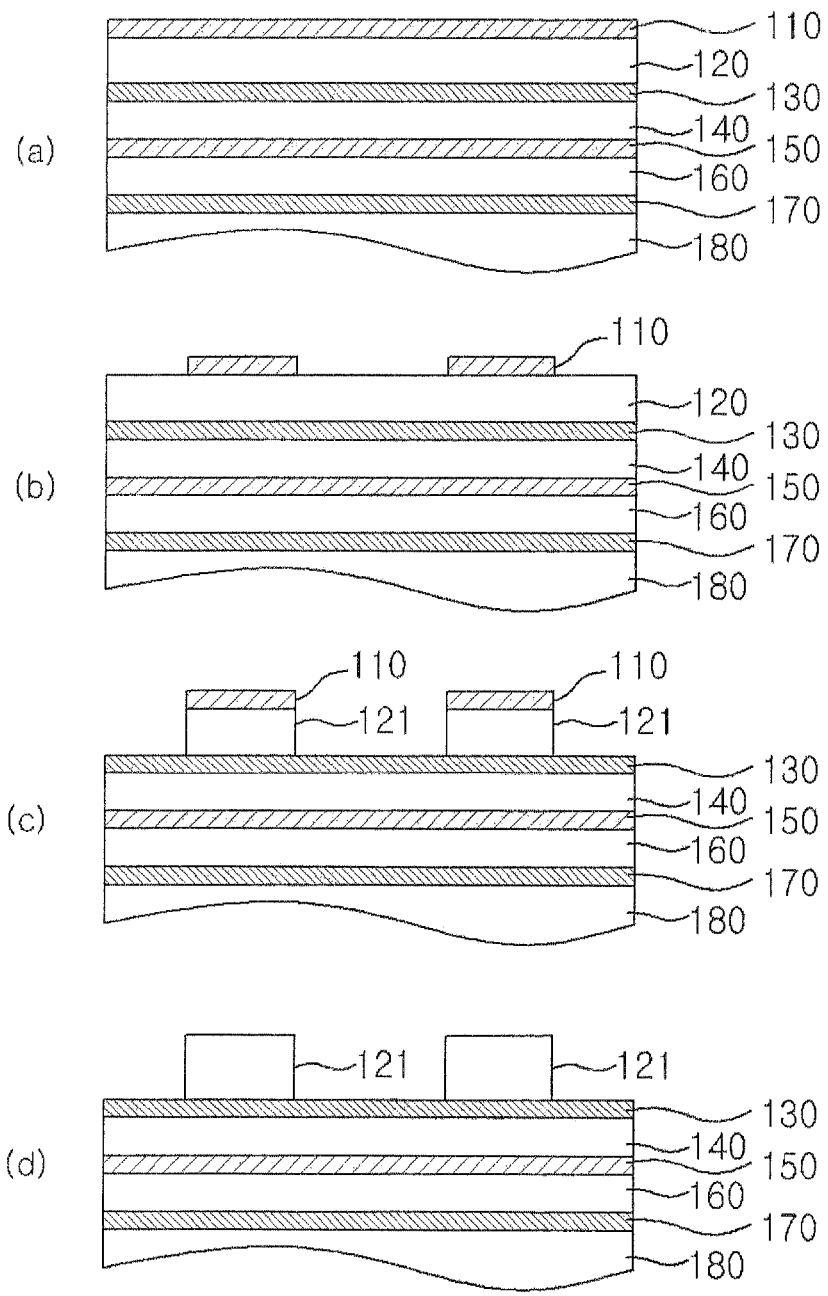
FIGS. 2 to 4 are cross-sectional views illustrating a manufacturing process according to a first embodiment of the present invention.
Figure 3:
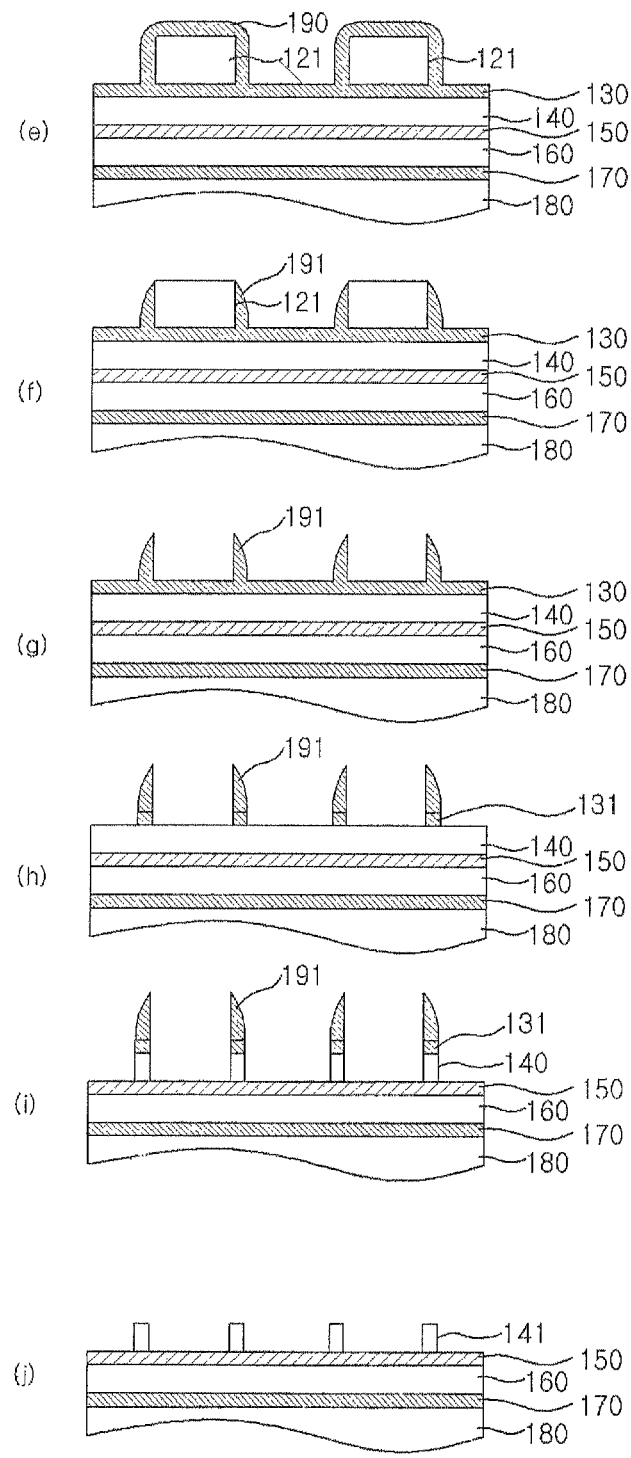

Referring to FIGS. 2 and 3, in step S1, multilayer main thin films isolated by passivation layers are formed. The main thin film according to the present invention is a generic term for thin film layers that may be formed of a variety of materials. The main thin film includes a structure in which thin films formed of the same material or different materials are stacked in multilayers.

Specifically, as illustrated in FIG. 2(a), the passivation layers refer to dielectric layers 110, 130, 150 and 170 for isolating adjacent main thin films. Due to the passivation layers, the respective main thin films 120, 140 and 160 form an isolated structure. The number of the layers in the multilayer structure of the main thin films according to the present invention may be changed according to the need for processes or the degree of a pitch to be reduced. In this embodiment, a stacked structure of three main thin films will be described as an example.

The main thin films 120, 140 and 160 have a peculiar structure in which they are stacked in multilayers and isolated by the passivation layers, and such a structure is a basic matter to which the present process is to be performed. The main thin film may be formed using a silicon thin film. More specifically, the main thin film may be formed using a silicon nitride film or a silicon oxide film by a deposition process, and the silicon thin film may be formed of any one of single-crystalline silicon, polycrystalline silicon, and amorphous silicon.

The respective passivation layers may be formed of the same material or different materials. In addition, as will be described below, the passivation layers may be formed in a two-layer structure or a multilayer structure.

Then, in step S2, as illustrated in FIGS. 2(b) to 2(d), a first passivation layer 110 is formed on the first main thin film 120 using a photoresist pattern (not shown) as a mask, and the first main thin film is etched using the first passivation layer 110 as a mask. Then, the first passivation layer 110 is removed. In this manner, a first main pattern 121 is formed.

(2) First Spacer Pattern Forming Process

Thereafter, as illustrated in FIG. 3(e), a spacer layer 190 is formed on the first main pattern 121 by a deposition process. As illustrated in FIG. 3(f), an upper portion of the spacer layer 190 is vertically etched to expose an upper portion of the first main pattern 121. In this case, the vertical etching refers to an etching process that performs an etching in a downward direction from the top surface of the spacer layer 190. The vertical etching process may be achieved by a dry etching process. As illustrated in FIG. 3(g), the first main pattern 121 is removed to form a first spacer pattern 191.

The spacer layer 190 may be formed using a silicon oxide film. In this case, if the second passivation layer and the spacer layer are formed of the same material, the second passivation layer can also be removed effectively in a subsequent spacer removing process.

As illustrated in FIG. 3(h), the second passivation layer 130 exposed under the first spacer pattern 191 is etched to expose the second main thin film 140. Thereafter, as illustrated in FIG. 3(i), the exposed second main thin film 140 is vertically etched using the first spacer pattern 191 or the second passivation layer 131 as a mask. As illustrated in FIG. 3(j), the first spacer pattern or the second passivation layer is removed to form a second main pattern 141.

In this case, as illustrated in FIGS. 3(h) and 3(i), if the first spacer pattern 191 and the second passivation layer 131 are formed of the same material, the second main thin film 140 is etched in such a state that the first spacer pattern 191 and the second passivation layer 131 are formed. In the process of FIG. 3(h), if the first spacer pattern 191 and the second passivation layer 131 are formed of different materials, the first spacer pattern 191 is removed and the second main thin film 140 is etched using the second passivation layer 131 as a mask.

If the period of the first main pattern or the photo mask pattern forming the first main pattern is T, the period of the spacer pattern may be T/2. It is more preferable that the width of the spacer pattern is equal to the line width of the second main pattern disposed under the spacer pattern.

(3) Pattern Pitch Reducing Process

Figure 4:
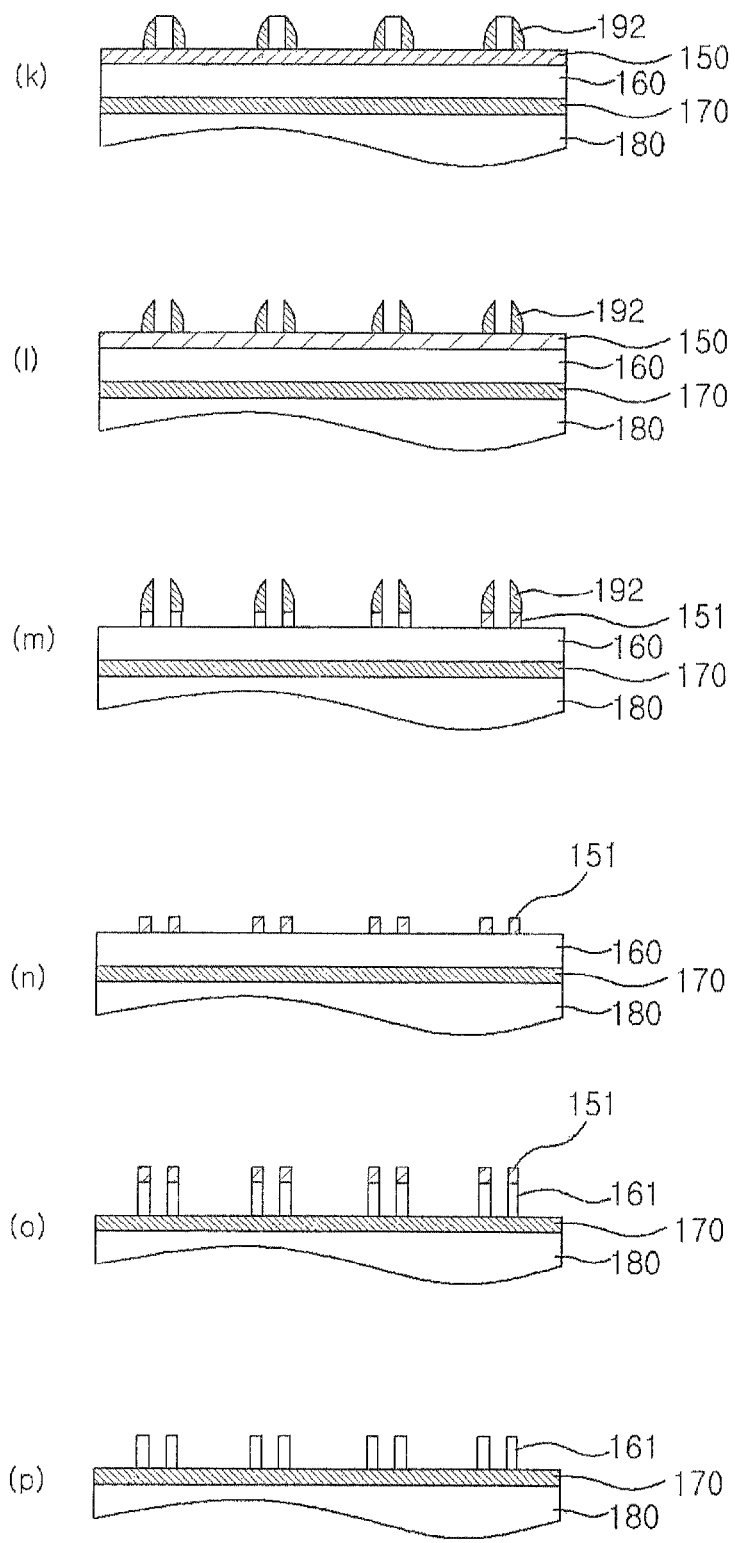

Referring to FIG. 4, after the first main pattern described above is formed, the following processes are repeated to effectively reduce a pattern pitch.

In this embodiment, the pattern pitch reducing process may be achieved by forming a second spacer pattern with respect to the second main pattern 141 illustrated in FIG. 3(j), and forming a third main pattern 161 by transferring the second spacer pattern 192 onto a third main thin film.

Specifically, as illustrated in FIG. 4(k), a material to be used as a spacer is deposited on the second main pattern 141. As described above, the spacer material is vertically etched by a dry etching process to expose the top surface of the second main pattern 141. As illustrated in FIG. 4(l), the second main pattern 141 is removed to form a second spacer pattern 192.

Then, a third passivation layer 150 exposed under the second spacer pattern 192 is etched using the second spacer pattern 192 as a mask. A third main pattern 161 is formed by patterning a third main thin film 160 using the second spacer pattern 192 or the third passivation layer 151 as a mask. As illustrated, while the third main thin film 160 may be etched using the third passivation layer 151 as a mask, the second spacer pattern and the third passivation layer may be removed after etching the third main thin film 160 using the second spacer pattern and the third passivation layer as a mask (see FIGS. 4(m) to 4(p)).

The above-describe pattern pitch reducing process can continuously reduce the pattern pitch by repeating a process of forming a spacer layer on a third main thin film, forming a spacer pattern, and forming a fourth main pattern.

Second Embodiment

Figure 5:
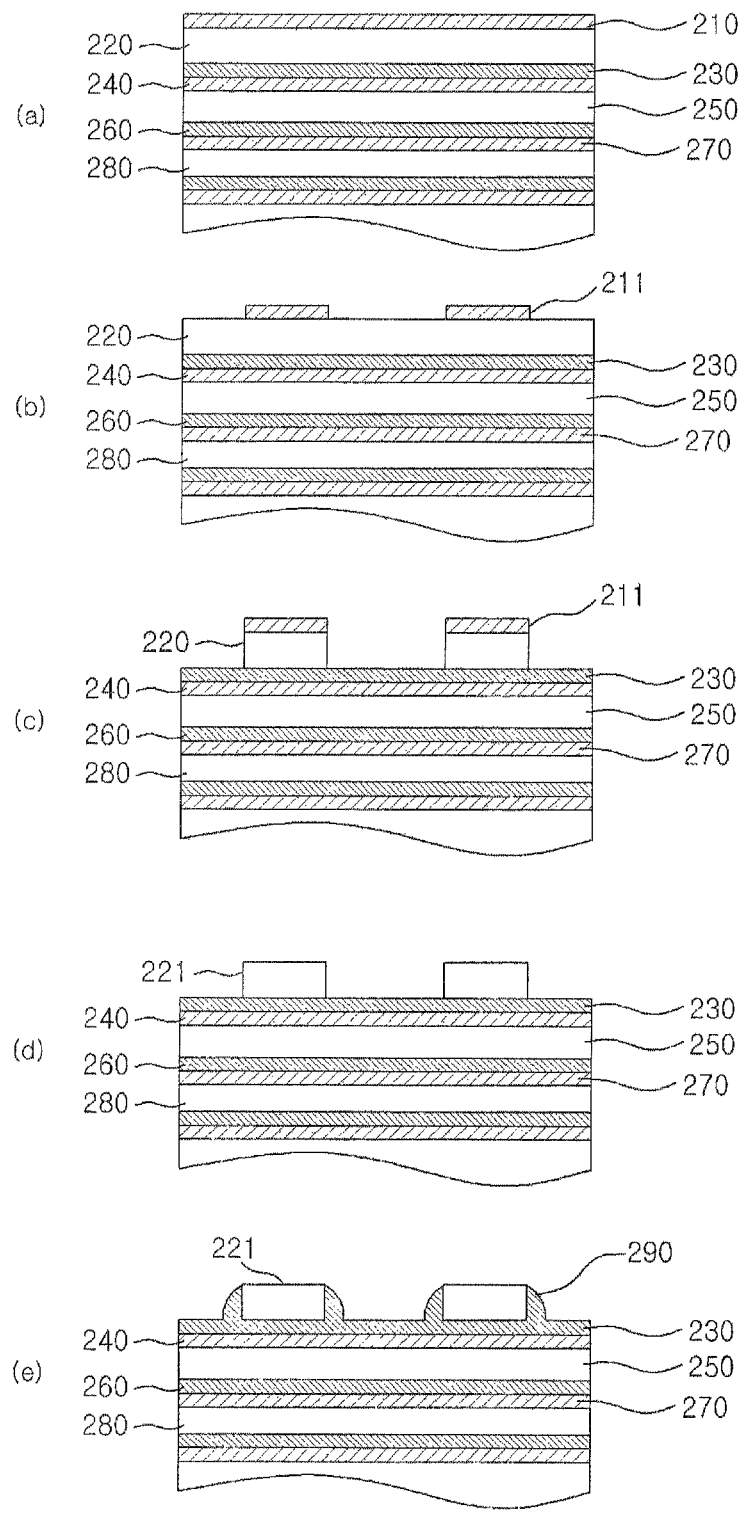
FIGS. 5 and 6 are cross-sectional views illustrating a manufacturing process according to a second embodiment of the present invention.
Figure 6:
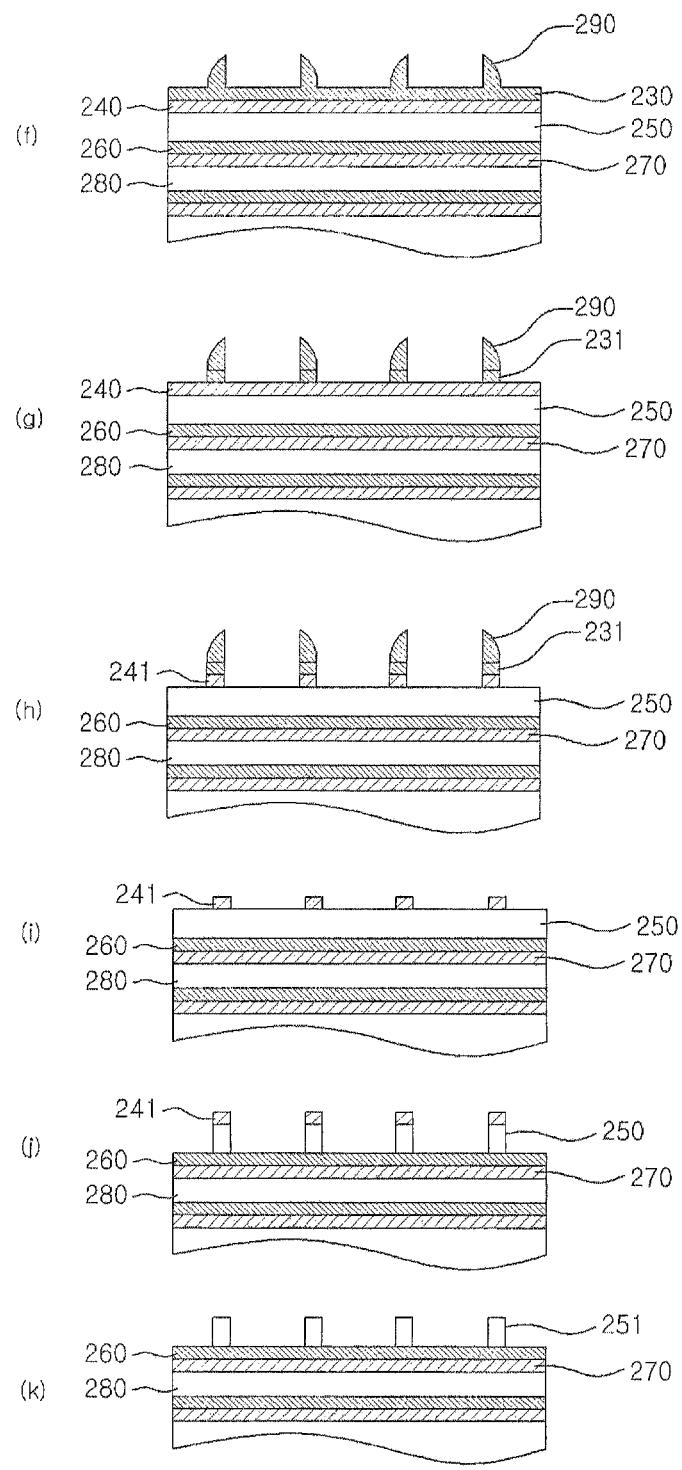

FIGS. 5 and 6 are cross-sectional views illustrating another embodiment of the present invention.

Referring to FIGS. 5 and 6, the second embodiment is different from the first embodiment in that a multilayer main thin film structure in which passivation layers are formed in two or more layers is used, and it is identical to the first embodiment in that the pattern pitch is reduced by forming a spacer pattern and transferring the spacer pattern onto a main thin film disposed thereunder.

As illustrated in FIGS. 5(a) and 5(b), passivation layers for isolating a stacked structure of multilayer main thin films 220, 250 and 280 are formed with two layers, and the uppermost passivation layer 211 is patterned. Then, as illustrated in FIG. 5(c), a first main pattern 221 is formed using the patterned passivation layer 211 as a mask, and the passivation layer 211 is removed.

As illustrated in FIG. 5(d), a spacer material layer is deposited, and the first main pattern is exposed by a vertical etching process. As illustrated in FIGS. 5(e) and 5(f), the first main pattern 221 is removed to form a first spacer pattern 290. As illustrated in FIGS. 5(g) and 5(h), second passivation layers 231 and 241 are etched. As illustrated in FIG. 5(i), a second main pattern 251 is formed by etching the second main thin film 250 using the first main pattern 221 or the second passivation layers 231 and 241 as a mask. In FIGS. 5(h) and 5(i), the process of etching the second main thin film using the patterns of the second passivation layer 241 as a mask is taken as an example.

Third Embodiment

Figure 7:
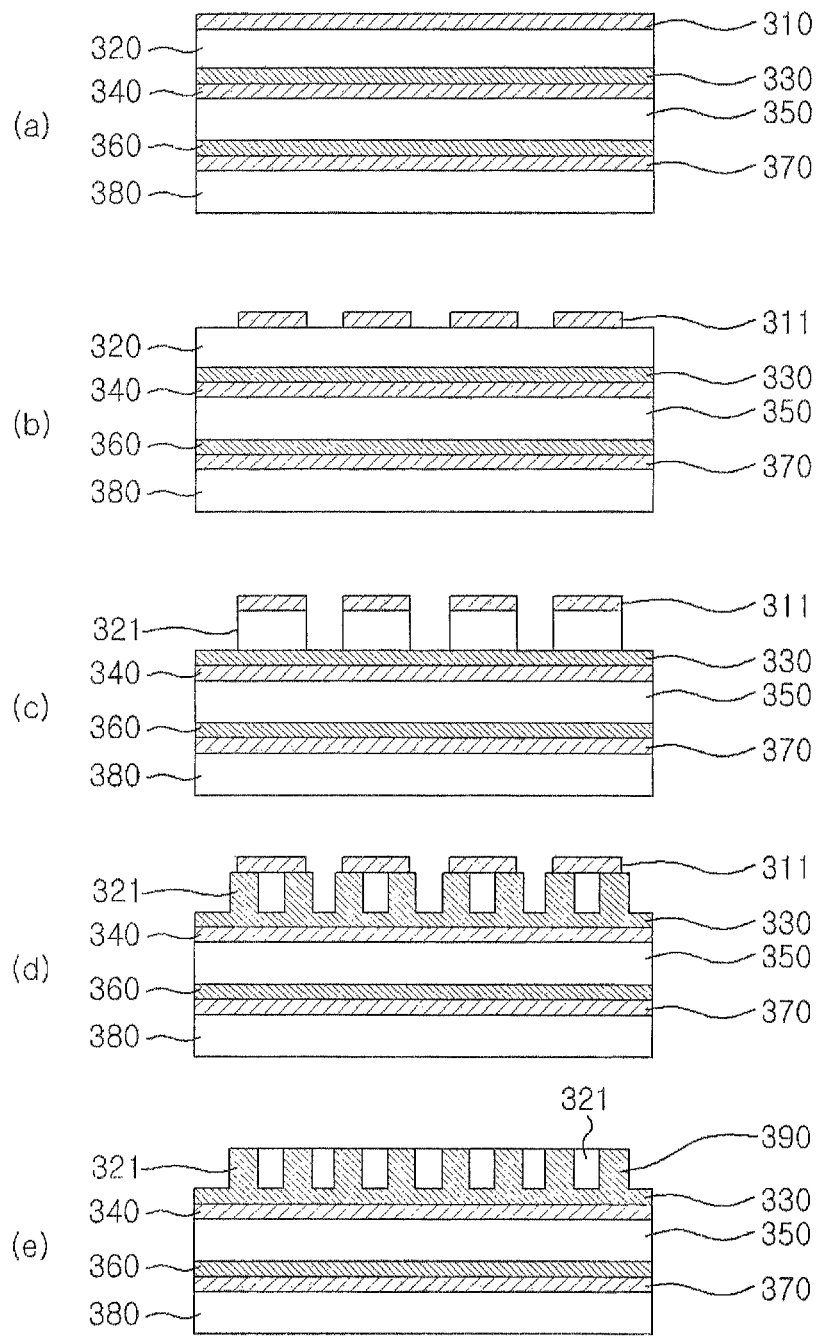
FIGS. 7 and 8 are cross-sectional views illustrating a manufacturing process according to a third embodiment of the present invention.
Figure 8:
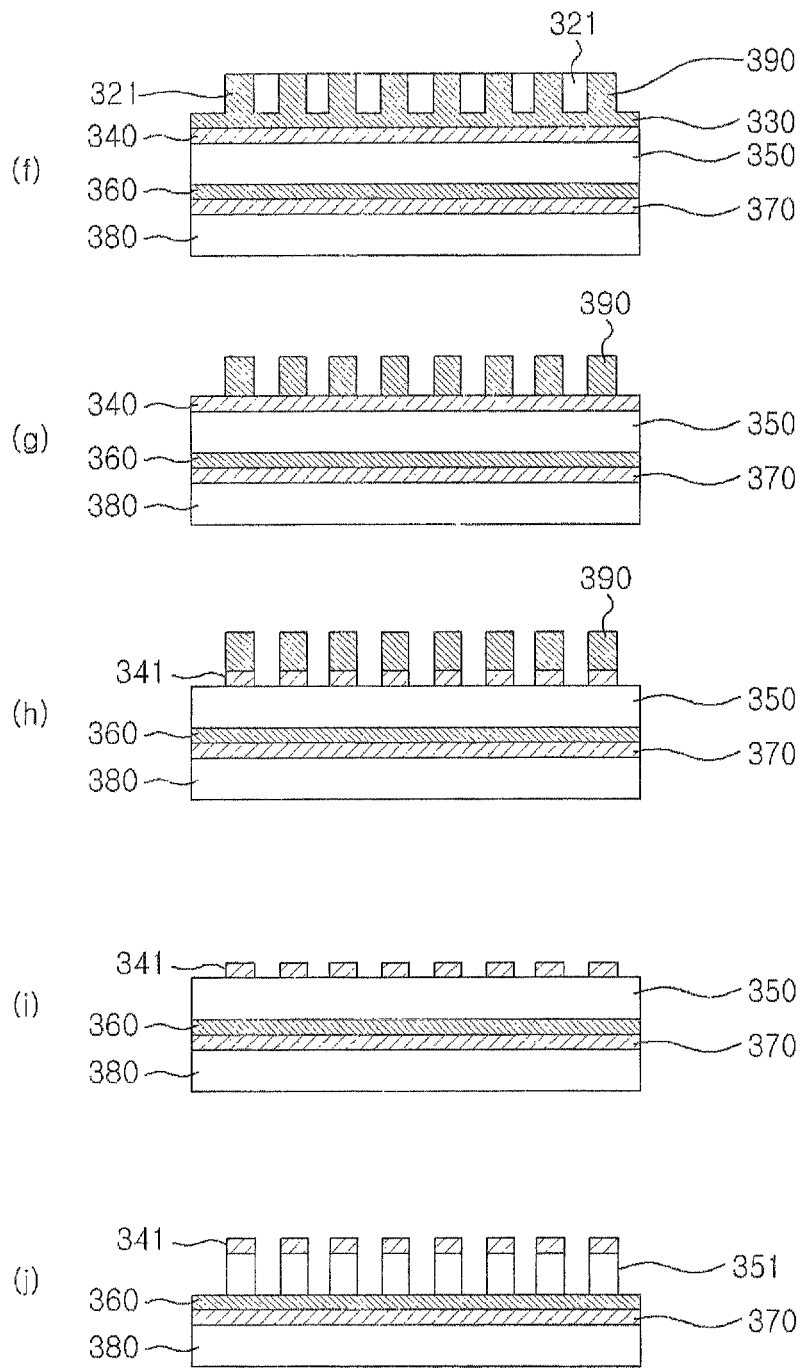

Another embodiment of the present invention will be described below with reference to FIGS. 7 and 8.

The third embodiment is different from the first and second embodiments in that a main pattern is oxidized to form a side spacer pattern, instead of forming a spacer pattern by depositing a spacer material.

As illustrated in FIG. 7(a), passivation layers 330, 340, 360 and 370 are provided to isolate main thin films 320 and 350. The case in which the passivation layers are formed in a two-layer structure will be described as an example.

As illustrated in FIGS. 7(b) and 7(c), a first passivation layer 310 is patterned and a first main thin film 320 is patterned to form a first main pattern 321.

As illustrated in FIG. 7(d), the exposed first main pattern is oxidized to form a spacer on a side of the main pattern (hereinafter, referred to as a side spacer).

As illustrated in FIGS. 7(e) and 8(f), the first passivation layer 311 is removed, and a main pattern region 321 that is not oxidized at the central part of the side spacer is removed.

As illustrated in FIGS. 8(g) and 8(h), the exposed second passivation layers 330 and 340 are removed. As illustrated in FIGS. 8(i) and 8(j), a second main pattern 351 is formed by patterning the second main thin film 350 using the side spacer pattern 390 or the second passivation pattern 341 as a mask. Thereafter, the side spacer pattern 390 is removed. The process of forming the second main pattern 351 using the second passivation pattern 341 as a mask is illustrated.

It is preferable that the period of the side spacer pattern 321 is T/2 of the period (T) of a photoresist pattern used to pattern the first main thin film at the first time, and the width of the side spacer pattern is equal to the line width of the second main pattern to be formed thereunder. In addition, as in the case of the above-described embodiment, the pattern pitch can be reduced by repeating the processes of FIGS. 7(d) to 8(i) on the second side spacer pattern 390.

In the embodiment of the process according to the present invention, it is preferable that the period of the first main pattern of the upper part is two times the period of the second main pattern to be formed at the lower part. Furthermore, it is preferable that the processes are performed such that the line width of the first main pattern is equal to the distance between the second main patterns. In addition, the distance between the first main patterns may be two or more times the line width of the second main pattern.

While the invention has been shown and described with reference to exemplary embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:

1. A method for fabricating large-area nanoscale patterns, comprising:
    forming multilayer main thin films isolated by passivation layers;
    etching a first main thin film using a first passivation layer on an upper portion of the first main thin film and
    removing the first passivation layer to form a first main pattern;
    forming a spacer layer covering the first main pattern and etching an upper surface of the spacer layer
        to form a first spacer pattern
        to expose an upper portion of the first main pattern,
    removing the first main pattern, and
    thereafter etching a second passivation layer
        under the first spacer pattern
        using the first spacer pattern;
    vertically etching a second main thin film
        under the second passivation layer
        using the first spacer pattern and the second passivation layer and
    removing the first spacer pattern and the second passivation layer to form a second main pattern;
    depositing a spacer material on the second main pattern and
    vertically etching the deposited spacer material on the second main pattern to form a second spacer pattern, and
    thereafter removing the second main pattern;
    etching a third passivation layer under a second main film using the second spacer pattern, and
    thereafter removing the second spacer pattern; and
    etching a third main thin film using the third passivation layer and
    removing the third passivation layer to form a third main pattern.

2. The method of claim 1, wherein the passivation layers are formed using a silicon nitride film or a silicon oxide film.

3. The method of claim 2, wherein the main thin films are formed of any one of single-crystalline silicon, polycrystalline silicon, and amorphous silicon.

4. The method of claim 1, wherein the process of forming the spacer layer on the first main pattern is performed by a deposition process.

5. The method of claim 1, wherein the spacer layer is formed of the same material as the passivation layers.

6. The method of claim 1, wherein the period of the first main pattern of the upper part is two times the period of the second main pattern to be formed at the lower part.

7. The method of claim 6, wherein the line width of the first main pattern is equal to the distance between the second main patterns.

8. The method of claim 6, wherein the distance between the first main patterns is two or more times the line width of the second main pattern.

* * * * *